(12) United States Patent
Le et al.

(10) Patent No.: US 6,510,082 B1
(45) Date of Patent: Jan. 21, 2003

(54) DRAIN SIDE SENSING SCHEME FOR VIRTUAL GROUND FLASH EPROM ARRAY WITH ADJACENT BIT CHARGE AND HOLD

(75) Inventors: Binh Q. Le, San Jose, CA (US); Pau-Ling Chen, Saratoga, CA (US); Michael A. Van Buskirk, Saratoga, CA (US); Santosh K. Yachareni, Santa Clara, CA (US); Michael S. C. Chung, San Jose, CA (US); Kazuhiro Kurihara, Sunnyvale, CA (US); Shane Hollmer, San Jose, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/999,869

(22) Filed: Oct. 23, 2001

(51) Int. Cl.[7] ............................................. G11C 16/04
(52) U.S. Cl. ............................. 365/185.16; 365/185.21
(58) Field of Search ....................... 365/185.16, 185.21, 365/185.23, 185.14, 189.09, 230.06

(56) References Cited

U.S. PATENT DOCUMENTS

| 5,027,321 | A | * | 6/1991 | Park | 365/185.02 |
| 5,959,892 | A | * | 9/1999 | Lin et al. | 365/185.16 |
| 6,134,156 | A |  | 10/2000 | Eitan |  |
| 6,191,976 | B1 |  | 2/2001 | Smayling et al. |  |
| 6,195,287 | B1 |  | 2/2001 | Hirano |  |
| 6,201,737 | B1 |  | 3/2001 | Hollmer et al. |  |

* cited by examiner

*Primary Examiner*—Richard Elms
*Assistant Examiner*—Anh Phung
(74) *Attorney, Agent, or Firm*—Eschweiler & Associates, LLC (57) ABSTRACT

A system is disclosed for producing an indication of the logical state of a flash memory cell for virtual ground flash memory operations. The system comprises a bit line charge and hold circuit which is operable to apply a read sense voltage (e.g., about 1.2 volts) to a bit line associated with the drain terminal of a cell of the flash array adjacent to the cell which is sensed, wherein the applied drain terminal voltage is substantially the same as the cell sense voltage (e.g., about 1.2 volts) applied to the drain terminal bit line of the selected memory cell to be sensed. The system further includes a selective bit line decode circuit which is operable to select the bit lines of a memory cell to be sensed and the bit line of an adjacent cell, and a core cell sensing circuit which is operable to sense a core cell sense current at a bit line associated with a drain terminal of the selected memory cell to be sensed during memory read operations, and produce an indication of the flash memory cell logical state, which is substantially independent of charge sharing leakage current to an adjacent cell.

13 Claims, 9 Drawing Sheets

DRAIN SIDE SENSING SCHEME FOR VIRTUAL GROUND FLASH EPROM ARRAY WITH ADJACENT BIT CHARGE AND HOLD

FIELD OF INVENTION

The present invention relates generally to memory systems and in particular, to virtual ground flash EPROM memory array systems and methods to eliminate the effects of charge sharing leakage currents to adjacent bits and loss in transient sense current during memory cell current read operations, resulting in substantially improved signal margins.

BACKGROUND OF THE INVENTION

Flash and other types of electronic memory devices are constructed of thousands or millions of memory cells, adapted to individually store and provide access to data. A typical memory cell stores a single binary piece of information referred to as a bit, which has one of two possible states. The cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read, program, or erase operations through address decoding circuitry, whereby such operations may be performed on the cells within a specific byte or word. The individual memory cells are typically comprised of a semiconductor structure adapted for storing a bit of data. For instance, many conventional memory cells include a metal oxide semiconductor (MOS) device, such as a transistor in which a binary piece of information may be retained. The memory device includes appropriate decoding and group selection circuitry to address such bytes or words, as well as circuitry to provide voltages to the cells being operated on in order to achieve the desired operation.

The erase, program, and read operations are commonly performed by application of appropriate voltages to certain terminals of the cell MOS device. In an erase or program operation the voltages are applied so as to cause a charge to be stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access to other devices in a system in which the memory device is employed.

Flash memory is a type of electronic memory media which can be rewritten and hold its content without power. Flash memory devices generally have life spans from 100K to 1MEG write cycles. Unlike dynamic random access memory (DRAM) and static random access memory (SRAM) memory chips, in which a single byte can be erased, flash memory is typically erased and written in fixed multi-bit blocks or sectors. Conventional flash memories are constructed in a cell structure wherein a single bit of information is stored in each flash memory cell. In such single bit memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

Figure 1:
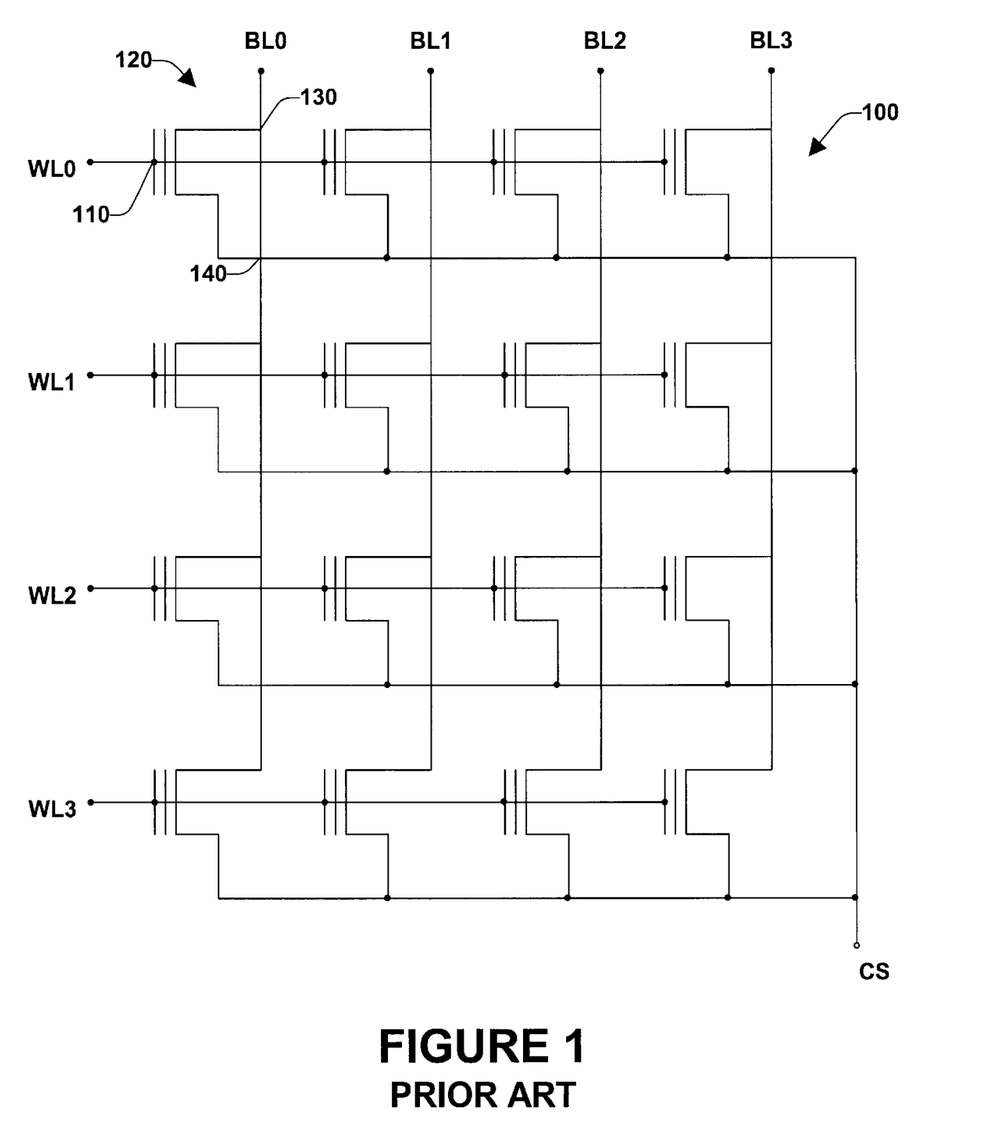
FIG. 1 is a schematic diagram which illustrates a conventional NOR flash memory architecture.

FIG. 1 illustrates a typical NOR configuration 100, wherein the control gate 110 is connected to a word line (e.g., WL0 thru WL3) associated with a row of such cells 120 to form sectors of such cells. In addition, the drain regions 130 of the cells are connected together by a conductive bit line (e.g., BL0 thru BL3). The channel of the cell conducts current between the source 140 and the drain 130 in accordance with an electric field developed in the channel by the stacked gate structure. In the NOR configuration, each drain terminal 130 of the transistors 120 within a single column is connected to the same bit line. In addition, each flash cell 120 associated with a given bit line has its stacked gate terminal 110 coupled to a different word line (e.g., WL1 thru WL4), while all the flash cells in the array have their source terminals 140 coupled to a common source terminal (CS). In operation, individual flash cells 120 are addressed via the respective bit line and word line using peripheral decoder and control circuitry for programming (writing), reading or erasing functions.

Such a single bit stacked gate flash memory cell is programmed, for example, by applying a relatively high voltage to the control gate and connecting the source to ground and the drain to a predetermined potential above the source. A resulting high electric field across the tunnel oxide leads to a phenomena called "Towler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bit line, which may be connected to the drains of other cells in a byte or word group. The voltage at the drain in conventional stacked gate memory cells is typically provided at between 0.5 and 1.0 volts in a read operation. A voltage is then applied to the gate (e.g., the word line) of the memory cell transistor in order to cause a current to flow from the drain to source. The read operation gate voltage is typically applied at a level between a programmed threshold voltage ($V_T$) and an unprogrammed threshold voltage. The resulting current is measured, by which a determination is made as to the data value stored in the cell.

Figure 2:
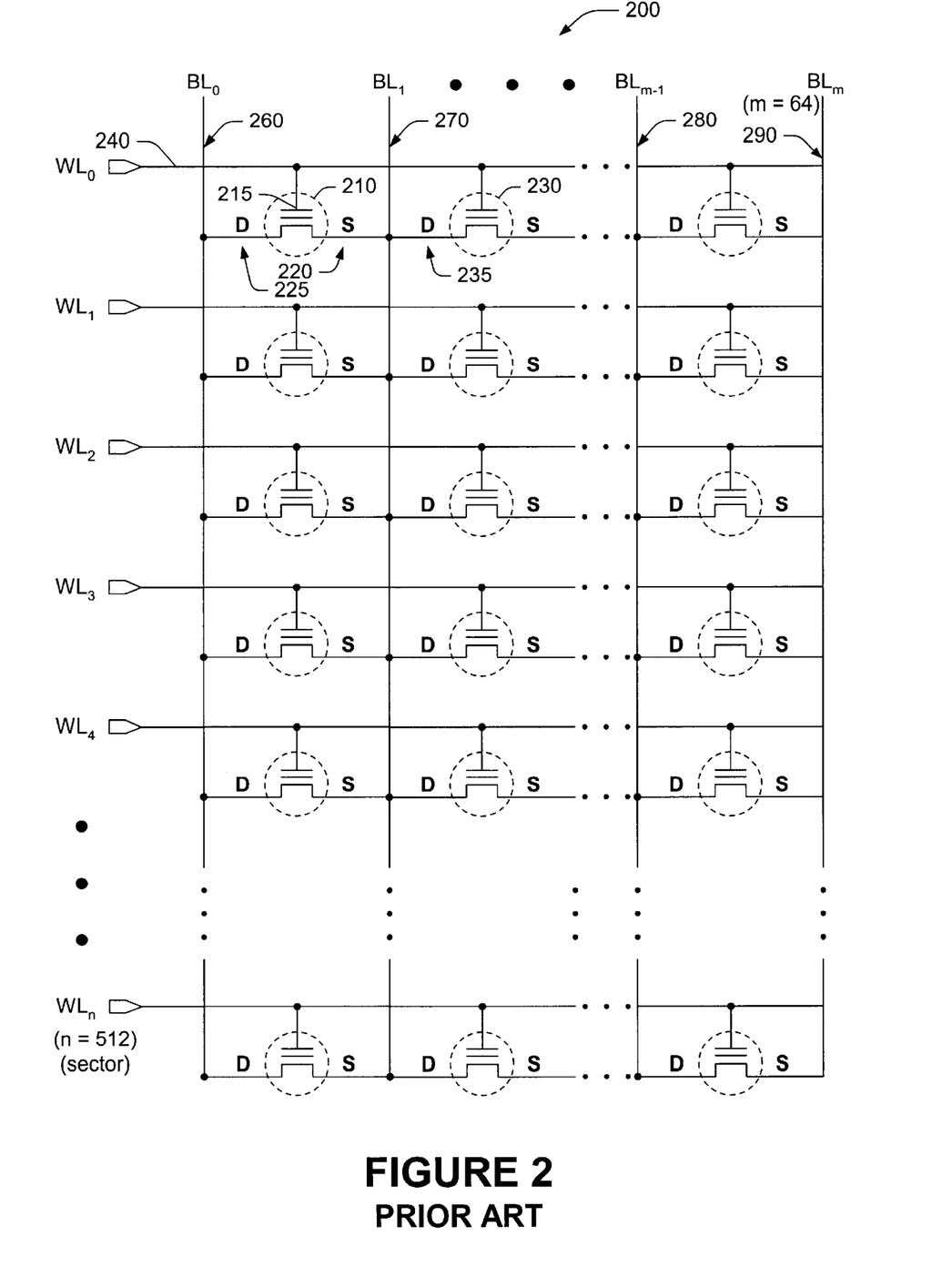
FIG. 2 is a schematic diagram which illustrates a conventional virtual ground flash EPROM memory array.

In addition to the NOR configuration, some prior art flash memories also use a "virtual ground" architecture, as shown in FIG. 2. A typical virtual ground architecture 200 comprises rows 240 of flash cells 210 with its stacked gate terminal 215 coupled to an associated word line (e.g., $WL_0$ thru $WL_n$) 240, and columns (260, 270, 280, 290) of flash cell pairs (210 & 230) with a drain 235 of one transistor 230 coupled to an associated bit line (e.g., $BL_0$ thru $BL_m$) and the source 220 of the adjacent transistor 210 coupled to the same bit line 270. In addition, each single row of flash cells (e.g., 210 & 230) associated with a word line 240 is connected in series, with the source 220 of one cell 210 coupled to the drain 235 of an adjacent cell 230, wherein each drain terminal of the transistors within a single column is connected to the same bit line.

An individual flash cell is selected via the word line and a pair of bit lines bounding the associated cell. For example, in reading the flash cell 210, a conduction path would be established when a positive voltage is applied to the bit line ($BL_0$) 260 coupled to the drain of flash cell 210, and the source 220 which is coupled to the bit line ($BL_1$) 270, is selectively coupled to ground ($V_{SS}$). Thus, a virtual ground is formed by selectively switching to ground the bit line associated with the source terminal of only those selected flash cells which are to be programmed or read.

Figure 3:
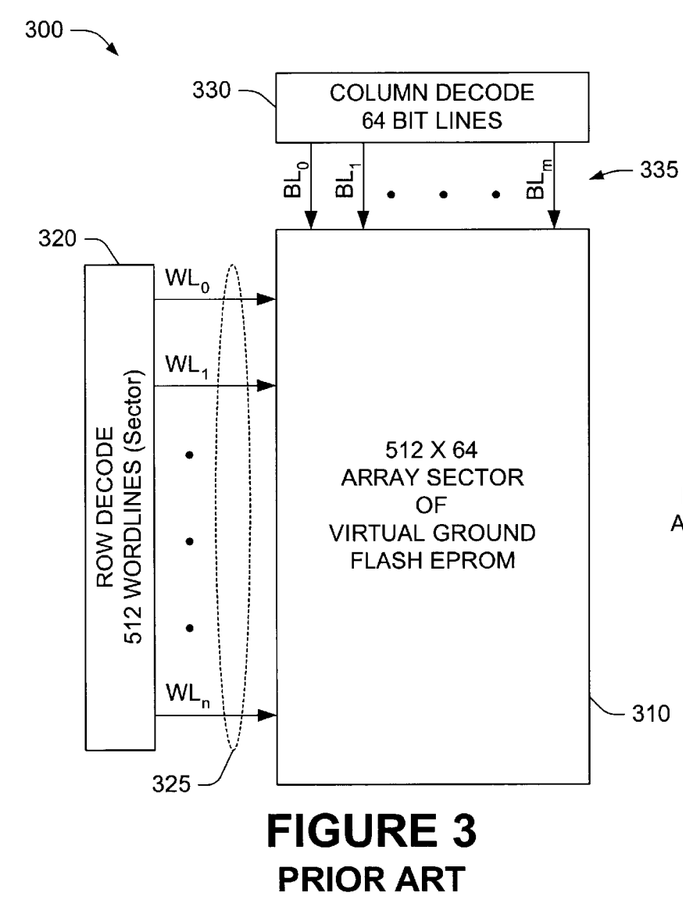
FIG. 3 is a simplified schematic illustration of a prior art virtual ground array of memory cells together with word line and bit line decode circuitry.

FIG. 3 illustrates that just as with the NOR configuration, the typical prior art virtual ground flash memory array sector 300 comprises both row decode logic circuits 320 for selecting one or more word lines 325, and column decode logic circuits 330 for selecting one or more bit lines 335. The array sector of flash cells 310, for example, comprises 512 rows and 64 columns of memory cells, which are associated with 512 word lines and 64 bit lines, respectively.

Figure 4:
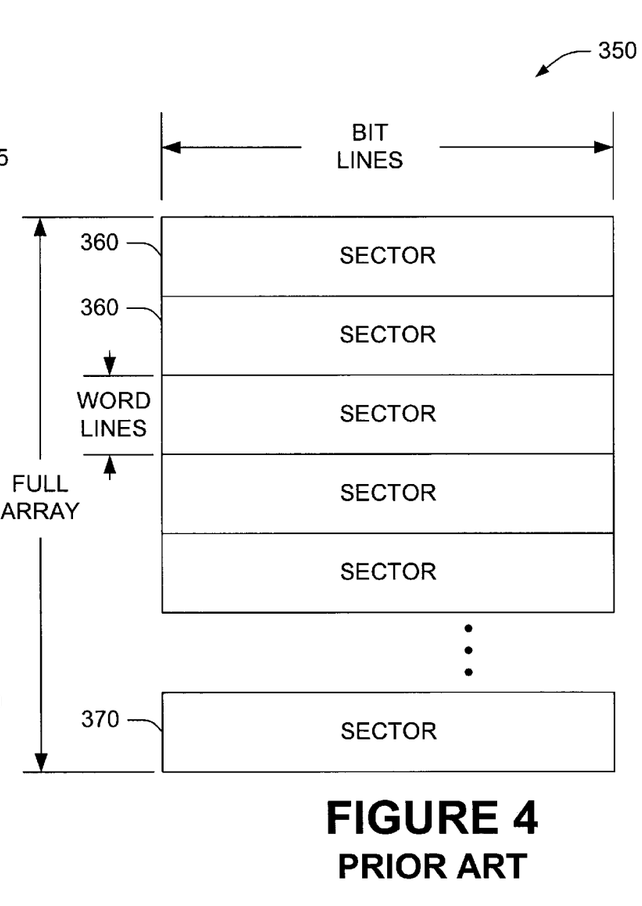
FIG. 4 is a block diagram demonstrating a configuration of a number of memory sectors into a larger memory array.

As shown in FIG. 4, a conventional prior art full array 350, may contain 16 such sectors (360 and 370) with associated word line and bit line decode logic.

Figure 5:
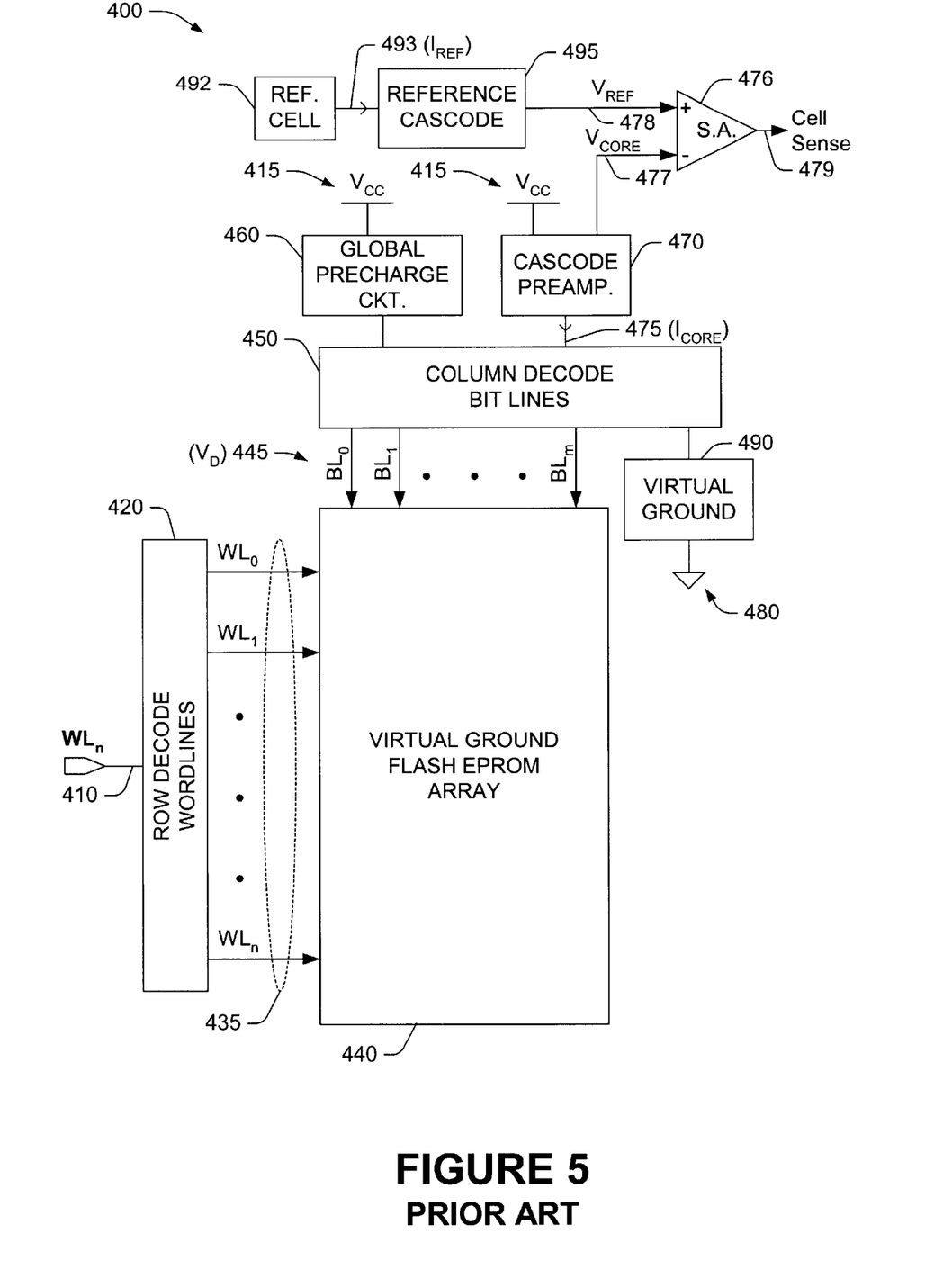
FIG. 5 is a system level functional block diagram illustrating a conventional scheme for indicating the state of a memory cell within a virtual ground array.

A typical prior art flash memory circuit configuration is shown in FIG. 5. The prior art virtual ground flash memory circuit 400, comprises both row decode logic circuits 420 for selecting one or more word lines 435, and column decode logic circuits 450 for selecting one or more bit lines 445. The array of flash cells 440, also comprises one or more sectors (e.g., 512 rows and 64 columns) of memory cells, which are associated with an equivalent number of word lines and bit lines.

The circuitry to read the flash cells of the prior art virtual ground circuit 400, contains a Global precharge circuit 460 which precharges all the bit lines of one or more sectors of the array with the same positive voltage $V_D$ (e.g., about 1.2 volts) 445, as is used to sense the flash cell current via a cascode current-to-voltage preamplifier circuit 470. The cascode preamplifier circuit 470 supplies the positive voltage $V_D$ generated from the $V_{cc}$ 415 to a bit line on the drain side of the selected flash cell within the array 440, while the source side of the selected cell is coupled thru another bit line to the ground 480 via the virtual ground switch circuitry 490 to generate a core cell sense current $I_{CORE}$ 475. The cascode preamplifier circuit 470, converts the core cell sense current $I_{CORE}$ 475 to a core cell sense voltage $V_{CORE}$ 477 for use in a sense amplifier 476. A reference cell 492 generates a reference current $I_{REF}$ 493 which is converted within a reference cascode 495 into a reference voltage $V_{REF}$ 478, which is compared to $V_{CORE}$ 477 in the sense amplifier 476.

During reading, this sense voltage $V_{CORE}$ 477 associated with the flash cell sense current $I_{CORE}$ 475, is compared to the reference voltage $V_{REF}$ 477 in the sense amplifier 476 to produce a core cell verification indication 479 that the correct flash cell logical state is stored at the desired location.

Figure 6:
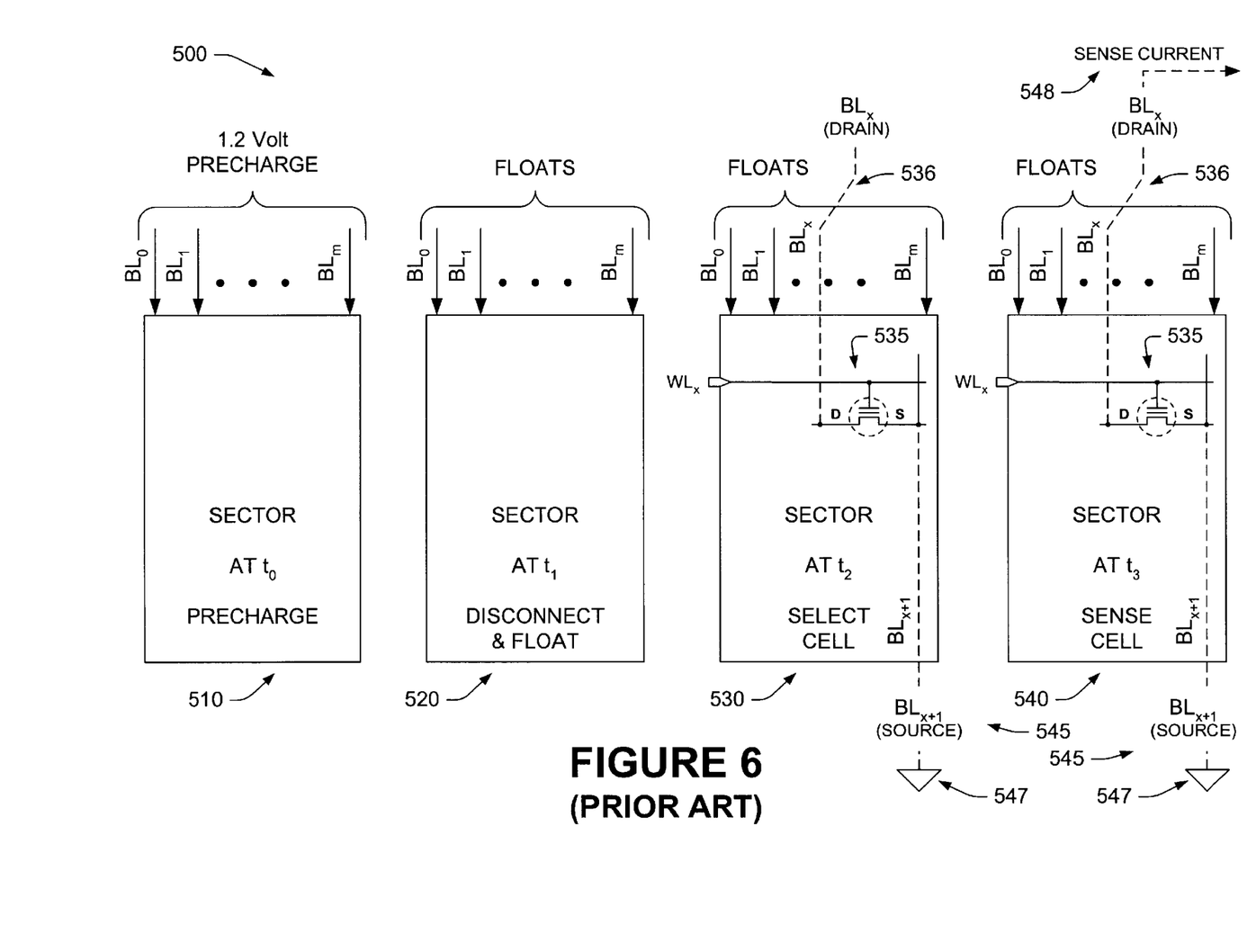
FIG. 6 is a simplified schematic diagram which illustrates four exemplary steps of a conventional scheme for reading the state of a cell in a virtual ground array.

FIG. 6 shows a method 500 and four basic steps (510, 520, 530, 540) which are employed to read conventionally a selected flash cell in the prior art virtual ground circuit of FIG. 5. Initially, in a step 510 which begins at time $t_0$, all bit lines ($BL_o$ thru $BL_m$ are first precharged to the same positive voltage $V_D$ (e.g., about 1.2 volts) as is used to sense the flash cell current. By a time $t_1$ 520, the bit lines are assumed to be precharged to a positive voltage $V_D$. The global precharge circuit voltage $V_D$, is then disconnected from all the bit lines at time $t_1$ 520, and the bit lines are allowed to float without an applied voltage. At time $t_2$ 530, a core cell 535 is selected with a bit line $BL_X$ 536 at the drain side of the cell, and with an adjacent bit line $BL_{X+1}$ 545 at the source side of the cell; and a word line $WL_X$ coupled to the gate of the cell 535 to be sensed, while all other bit lines continue to float. Also during this step, the bit line $BL_{X+1}$ 545 is selectively coupled as a virtual ground to ground 547. At time $t_3$ 540, the flash cell 535 sensing operation 548 begins with the application of a word line voltage at $WL_X$, a bit line voltage $V_D$ at 536 to the drain, and a ground 547 to the source 545 of the selected flash cell 535.

Thus, an individual flash cell is selected via a word line and a pair of bit lines bounding the associated cell. For example, in reading a flash cell of the sector of FIG. 6, a conduction path is established when a positive voltage $V_D$ is applied to one of the bit lines (e.g., $BL_X$) 536 coupled to the drain of a flash cell, the source of the flash cell is coupled to an adjacent bit line (e.g., $BL_{+1}$) 545, which is selectively coupled to ground ($V_{SS}$) 547, and an appropriate word line (e.g., $WL_X$) voltage is applied to the gate of the selected cell.

With a current established in the selected core cell, the core cell sense current 548 is converted to a cell sense voltage $V_{CORE}$ within the cascode current-to-voltage preamplifier circuit which is passed to a sense amplifier (e.g., 476 of FIG. 5) wherein a comparison is made to a reference cell voltage $V_{REF}$ to produce a core cell verification indication (e.g., 479 of FIG. 5) of the correct logical state of the flash core cell.

Figure 7:
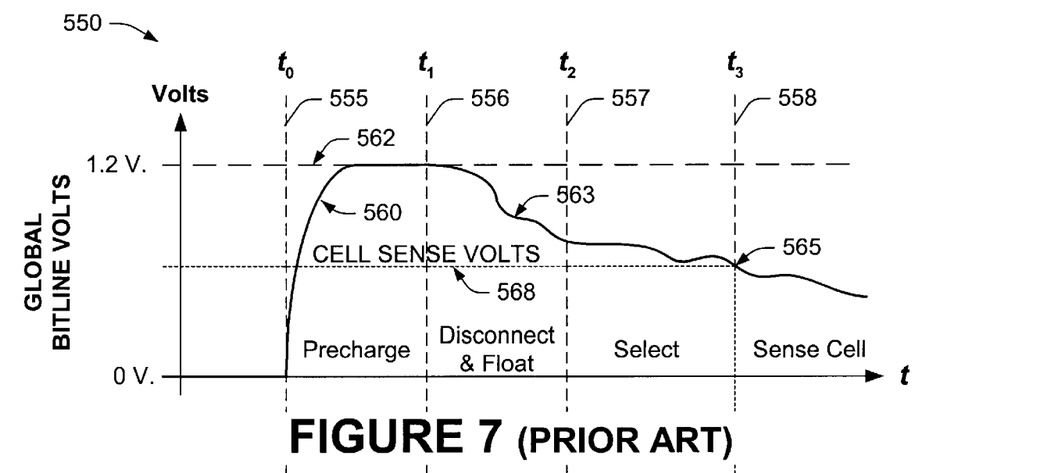
FIG. 7 is a waveform diagram illustrating a global bit line voltage versus time plot illustrating the bit line voltage changes of four exemplary steps of a conventional cell sensing scheme.
Figure 8:
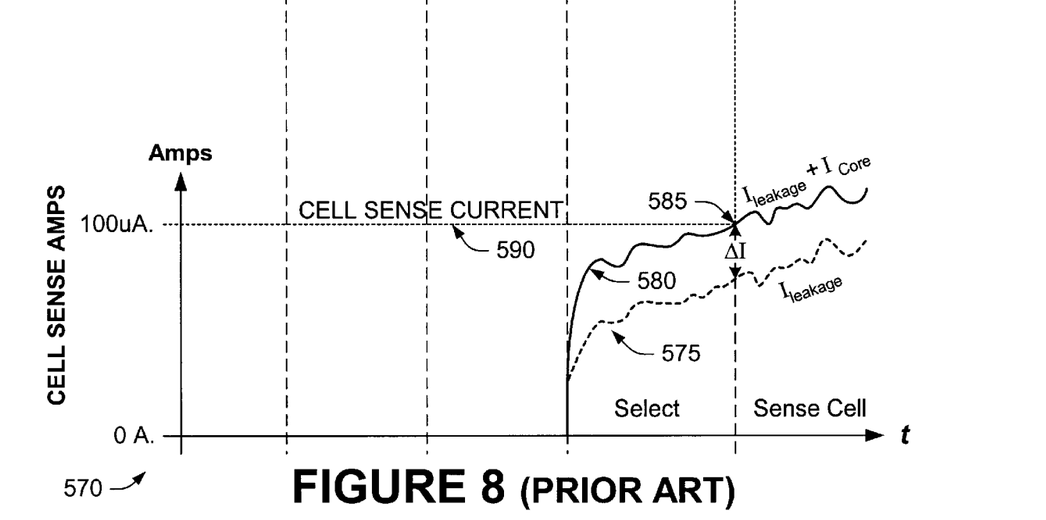
FIG. 8 is a waveform diagram illustrating a cell sense amperage versus time plot illustrating the cell sense current and leakage current changes of four exemplary steps of a conventional cell sensing scheme.

A drawback of the conventional method is best seen as in the global bit line voltage versus time plot 550 of prior art FIG. 7, and the core cell Sense current versus time plot 570 of prior art FIG. 8. As the global precharge of all the bit lines begins at time $t_0$ 555 in FIG. 7, the voltage on all the bit lines rapidly charges along line segment 560 toward the applied positive voltage $V_D$ (e.g., about 1.2 volts) 562. $V_D$ is briefly maintained on all the bit lines until time $t_1$ 556 at which point $V_D$ is disconnected from all the bit lines. After the precharge time $t_0$ 555, and before the core cell select time $t_2$ 557, the voltage $V_D$, which was applied globally to all the bit lines of one or more sectors, is allowed to float, and therefore discharges along the exemplary curve segment 563 to a lower voltage due to the leakage of the cells coupled to the selected word line. The amount of time that this positive voltage $V_D$ will remain on the bit lines after $V_D$ is disconnected, is an RC function of the combined distributed capacitance of all the cells on the word line, and the total leakage of all the individual cell leakages along each bit line.

The source of this cell leakage current is a result of the sharing of the charge between all the associated cells (called charge sharing), and the material properties of the semiconductor structures.

Also, since all the cells associated along a word line have their drains and sources coupled in series, these cells have a combined leakage path through the drain side of the cell being sensed. If a cell was selected, for example, at the end of the word line, there could be as many as 64 cells combined leakage seen at the drain side of the cell whose current is being sensed.

At time $t_2$ 557, the bit lines bounding the cell to be sensed are selected along with the associated word line. Upon selection, the flash core cell current $I_{CORE}$ is sensed by the cascode circuit and illustrated with line segment 580 of the cell sense current versus time plot of FIG. 8. The core cell current, however, is also being added to the total leakage current exhibited by all the cells coupled on the selected word line. In the example 570, the total sensed current $I_{LEAKAGE}+I_{CORE}$ (580) may be greater than the low core cell current $I_{CORE}$, which should be read as a logical "0". With a typical cell sense current set at, for example, about 100 uA (590), for the sense of a logical "0" state, the conventional cascode and sense amplifier circuitry would instead, incorrectly indicate a logical "1" state at 585 at time $t_3$ 558, as a result of the combined core cell current and leakage current.

Referring back to FIG. 7, the bit line voltage has continued to discharge and drop along line segment 563 until at time $t_3$ 558 the selected cell sense current is made. At a sense voltage 568 associated with this cell sense current 590, and point 565 on line segment 563, a voltage drop has been established between the drain of the cell being sensed and the drain of the adjacent drain side cell. The voltage drop induced across the cells increases the leakage currents in those cells, and increases the resultant error in the sense current readings (read signal margins).

Additionally, the voltage drop induced across the cells by the discharging voltage which was applied globally to the bit lines, has a dynamic or variable characteristic as shown in the curves 550 and 570. The dynamic characteristics of the leakage currents makes the cell sense current read operation inconsistent, and degrades the read signal margins. Such sense current variations degrades the ability in the read mode circuitry to discriminate accurately whether or not a cell is programmed.

Another drawback of the prior art sensing scheme, is the power which is wasted precharging all the bit lines of one or more sectors of the array.

Accordingly, there is a need for a stable, low power means of eliminating the effects of charge sharing leakage currents to adjacent bits and loss in transient sense current during memory cell current read operations, resulting in substantially improved signal margins in a virtual ground flash EPROM memory array system.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to a system and method of eliminating the effects of charge sharing leakage currents to adjacent flash cells and loss of sense current during memory cell current read operations, which result in substantially reduced read errors in a virtual ground flash memory array system.

The present invention provides bit line charge and hold circuitry, as well as a combination of selective bit line decode circuitry and methodologies by which cell read sense voltages may be applied to a specific bit line adjacent to a sensed memory cell during memory read operations, wherein applying a cell sense voltage $V_D$ (e.g., about 1.2 volts) to the bit line at the drain terminal (drain side bit line) of the cell adjacent to the drain side of the cell being sensed, reduces or cancels the leakage current which is conventionally associated with the adjacent cell.

Leakage current variations in the memory cells are typically reflected in the read sense current output of the memory cell sense amplifier circuit which causes incorrect indications of the memory cell logical states. These reading errors are referred to as "read margins". By applying the substantially same read sense voltage to the adjacent cell bit line, as is applied to the sensed cell, voltage drop across the adjacent cell is substantially eliminated and therefore variations in the read sense current output are avoided. The current output is applied to the cascode amplifier which produces an associated read sense voltage which is passed to a sense amplifier to produce the memory cell logical state indication. With the current variations due to adjacent cell leakage eliminated, a more consistent memory cell reading is insured. These features are provided by the drain side sensing scheme of the present invention.

A feature of the sensing scheme of the present invention is that it requires less power than conventional sensing schemes, as only two bit lines are charged, in contrast to all the bit lines of a sector or all the bit lines of an entire array being charged with conventional sensing schemes.

Another feature of the sensing scheme of the present invention is that a more stable output indication is possible than with conventional schemes by eliminating the dynamic characteristics due to leakage between adjacent cells and variations in the resultant cell sense current, and read signal margins are improved.

Yet another feature of the sensing scheme of the present invention is that by eliminating the effects of leakage to adjacent cells, leakage considerations as a part of manufacturing are reduced.

An advantage of the present invention over conventional sensing schemes, is the elimination of the dynamic discharge characteristic of the bit lines and array cells. In addition, the present invention also eliminates the variations of the cell current reading due to the timing of the reading after the cell sense voltage is disconnected. Thus, timing of the reading does not affect the actual reading.

Thus a memory system is disclosed for producing an indication of the logical state of a flash memory cell for virtual ground flash memory operations, which is substantially independent of charge sharing leakage currents to adjacent cells.

The aspects of the invention find application in devices which include virtual ground memory cells architectures, where memory cell leakages may be higher, and in association with memory devices employed in low power applications.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings, wherein like reference numerals are used to refer to like elements throughout. The present invention relates to a virtual ground flash EPROM array circuit and method for producing an indication of the logical state of a flash memory cell for virtual ground flash memory operations. The system comprises a bit line charge and hold circuit which is operable to apply a read sense voltage (e.g., about 1.2 volts) to a bit line of the cell of the flash array adjacent to the cell which is sensed, wherein the applied voltage is substantially the same as the cell sense voltage (e.g., about 1.2 volts) applied to the bit line of the sensed cell. The system further includes a selective bit line decode circuit which is operable to select the bit lines of a memory cell to be sensed and the bit line of an adjacent cell during memory read operations, wherein applying substantially the same voltage to the bit line of the cell adjacent to the cell being sensed, reduces or cancels the leakage current which is conventionally associated with the adjacent cell. The system also includes a core cell sensing circuit which is operable to generate a core cell sense current from the memory cell, and produce an indication of the flash memory cell logical state, which is substantially independent of charge sharing leakage currents to adjacent cells.

Figure 9:
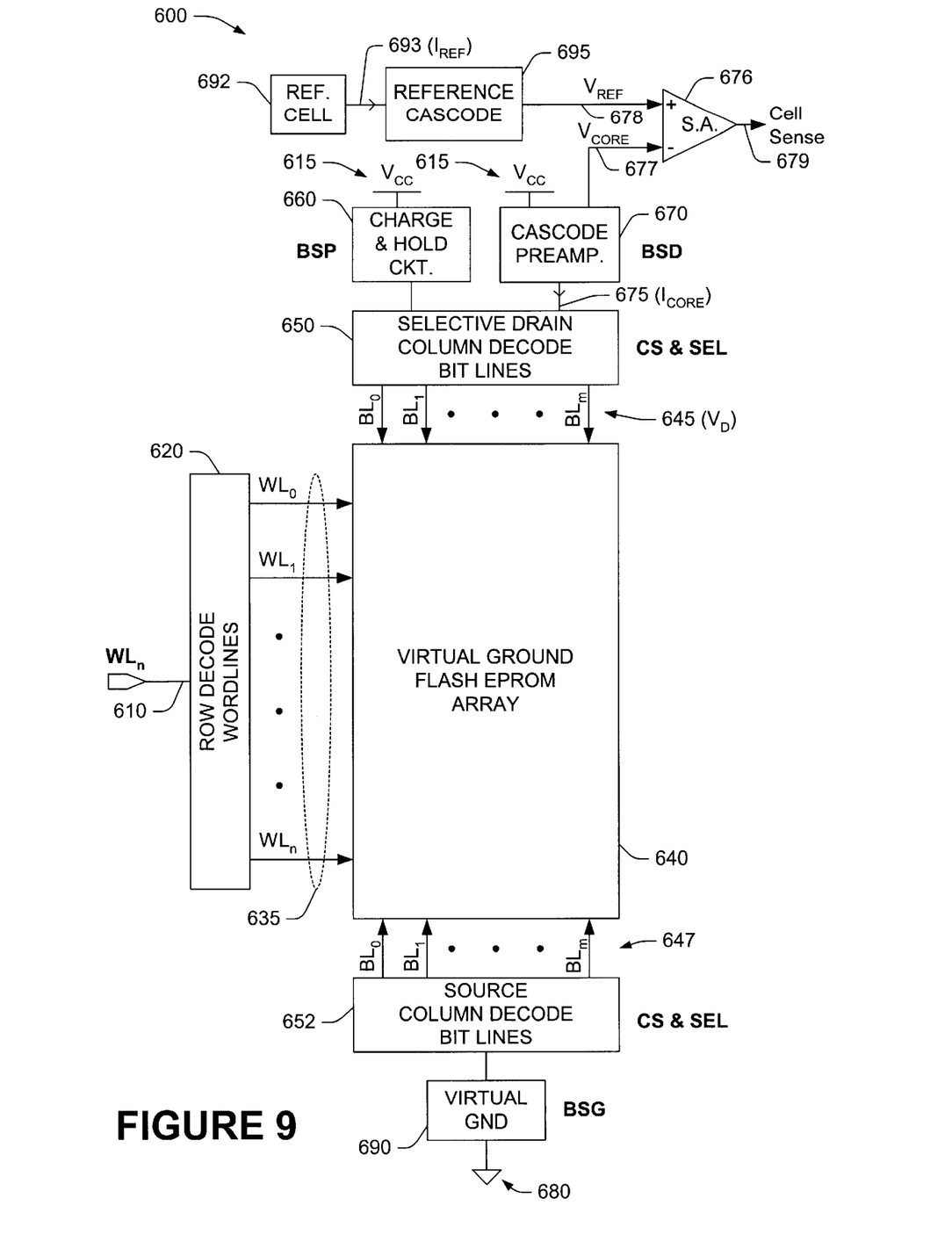
FIG. 9 is a system level functional block diagram illustrating an exemplary system for a drain side sensing scheme with adjacent bit charge, in which various aspects of the invention may be carried out.

Returning to the figures, FIG. 9 is a system level functional block diagram illustrating an exemplary system 600 for the drain side sensing scheme with adjacent bit charge, in which various aspects of the invention may be carried out.

The exemplary flash memory sensing scheme circuit configuration 600, comprises row decode logic circuitry 620 for selecting one or more word lines 635, selective drain column decode logic circuitry 650 for selecting one or more bit lines 645 which are coupled to memory cell drain terminals within the array 640, and source column decode logic circuitry 652 for selecting one or more bit lines 647 which are coupled to memory cell source terminals within the array 640. The array of flash cells 640, also comprises one or more sectors (e.g., 512 rows and 64 columns) of memory cells, which are associated with an equivalent number of word lines and bit lines.

The circuitry to read the flash cells of the virtual ground circuit 600, contains a charge and hold circuit 660 which charges only the selected bit lines of one or more sectors of the array with a positive voltage $V_D$ (e.g., about 1.2 volts) 645 generated from the $V_{CC}$ 615. The cascode current-to-voltage preamplifier circuit 670 senses the flash cell current, by supplying virtually the same positive voltage $V_D$ (e.g., about 1.2 volts) 645 generated from the $V_{CC}$ 615, via the selective drain column decode circuit 650 to a bit line on the drain side of the selected flash cell within the array 640. The source side of the selected cell is coupled thru an adjacent source side bit line via the source column decode circuit 652 to the ground 680 via the virtual ground switch circuitry 690 to generate a core cell sense current $I_{CORE}$ 675. The cascode preamplifier circuit 670, converts the core cell sense current $I_{CORE}$ 675 to a core cell sense voltage $V_{CORE}$ 677 for use in a sense amplifier 676. A reference cell 692 generates a reference current $I_{REF}$ 693 which is converted within a reference cascode 695 into a reference voltage $V_{REF}$ 678, which is compared to $V_{CORE}$ 677 in the sense amplifier 676.

During reading, this sense voltage $V_{CORE}$ 677 associated with the flash cell sense current $I_{CORE}$ 675, is compared to the reference voltage $V_{REF}$ 677 in the sense amplifier 676 to produce a core cell indication 679 of the correct flash cell logical state.

Figure 10:
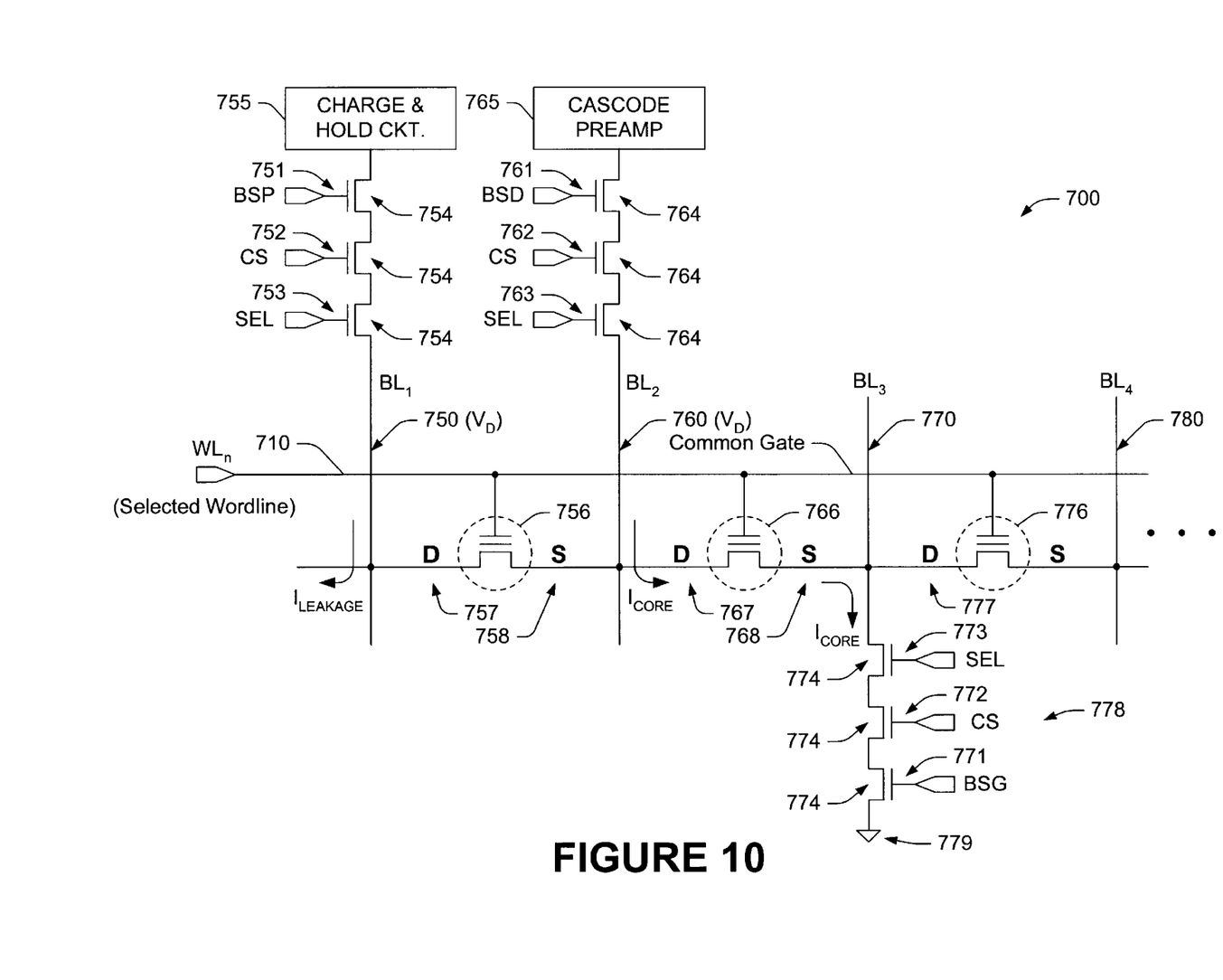
FIG. 10 is a simplified schematic illustration of an exemplary virtual ground array segment with a sensed cell and an adjacent cell, a bit line charge and hold circuit, cascode preamplifier, and virtual ground selection, in accordance with an aspect of the invention.

To better analyze the operation of the present invention, FIG. 10 is presented, which is a simplified schematic illustration of an exemplary virtual ground array segment 700 with a sensed cell 766 and an adjacent cell 756, a bit line charge and hold circuit 755, a cascode preamplifier 765, a virtual ground selection circuit 778, and a ground 779, in accordance with an aspect of the invention. Exemplary bit line elements $BL_1$ 750, thru $BL_4$ 780, may be selected by drain or source column decode circuits (not shown), along with an exemplary word line element $WL_n$ 710, to select one or more memory cells 756, 766, 776.

In the circuit 700, according to the present invention, a memory cell 766 is first chosen to be sensed, by selecting two bit lines which bound the drain and source terminals of the cell, and a word line coupled to the gate terminal of the cell. Specifically, cell 766 is selected by a drain bit line $BL_2$ 760, and a source bit line $BL_3$ 770, and a word line $WL_n$ 710 coupled to its gate terminal. The adjacent bit memory cell 756, which is adjacent to the drain terminal side (drain side) of the sensed cell 766, also has a drain side bit line $BL_1$ 750, which is also selected along with the drain side bit line $BL_2$ 760 for charging to the substantially same voltage $V_D$ (e.g., about 1.2 volts), by selectively coupling such voltage to the bit lines 750 and 760.

Both the charge and hold circuit 755, and the cascode preamplifier circuit 765, for example, receive the applied $V_{CC}$ power supply voltage (e.g. about 2.6 to 3.6 volts), and convert such voltage to an analog derivative of the $V_{CC}$ applied to bit lines 750 and 760 as $V_D$ (e.g., about 1.2 volts) according to one exemplary aspect of the present invention.

A virtual ground is applied to the selected cell 766 by the virtual ground selection circuit 778, and a ground 779. Column Select CS transistors 752, 762, and 772, and Select Line SEL transistors 753, 763, and 773, are used to select the desired drain side and source side bit lines for the memory cells respectively. The Byte Select Precharge BSP transistor 751 selects the application of the charge and hold circuit 755, while the Byte Select Drain BSD transistor 761 selects the application of the cascode preamplifier 765, and the Bit Select Ground BSG transistor 771 is part of the virtual ground selection circuitry for the source side of the cell to be sensed.

At the same time the drain side and source side virtual ground bit lines are selected for the cell 766 to be sensed, the drain side bit line of the adjacent bit cell is selected, and the word line of the sensed cell is selected. In addition, the charge and hold circuit 755 is selected with BSP 751, the cascode amplifier circuit 765 is selected with BSD 761, and the virtual ground circuit 778 selects the ground 779, the sense voltage $V_D$ is applied to bit lines 750 and 760. In the above manner, only selective bit lines are precharged (the bit line coupled to the drain of the selected cell 766 to be sensed and the bit line coupled to the drain of the adjacent cell 756).

A current path $I_{CORE}$ is established by the cascode preamplifier applying the sense voltage $V_D$ to the drain side bit line 760 through the sensed cell 766 to the source side bit line 770 and to the ground 779. This memory cell sense current $I_{CORE}$ through the sensed cell 766, is converted in the cascode preamplifier 765 to a sense voltage $V_{CORE}$ which is used for a memory cell sense indication in the sense amplifier (see FIG. 9).

In addition to the desired $I_{CORE}$ current path which is sensed by the preamplifier circuit 765, another charge sharing current path $I_{LEAKAGE}$ may exist in the virtual ground architecture 700, flowing from the drain side bit line 750 toward other successive memory cells associated with the selected word line 710 on the drain side of the adjacent bit memory cell 756 as illustrated. As all the cells toward the drain side of the adjacent bit memory cell 756 have no voltages applied to their bit lines and are floating, the voltage drops across those cells may produce leakage current paths to those cells. The present invention, however, eliminates leakage thru the adjacent cell, by applying the substantially same $V_D$ voltage to the drain side bit line of the adjacent cell and the cell being sensed.

By applying virtually the same voltage $V_D$ (e.g., about 1.2 volts), to both the drain side bit line 760 of the sensed cell 766 and the drain side bit line 750 of the adjacent cell 756, and by holding, or maintaining this same voltage to the sensed cell and the adjacent cell, any leakage currents which may flow from the adjacent bit memory cell 756 toward any other drain side cells along the word line, will have no leakage current effects on the sense current of the core cell $I_{CORE}$. In other words, if there is adjacent cell leakage, the method of the present invention, produces a "don't care" condition pertaining to the cell sense current.

By contrast, in conventional sensing schemes, where the precharge voltage is initially applied to all bit lines and then disconnected from bit lines of the drain side adjacent bit, the undesirable charge sharing $I_{LEAKAGE}$ current path flows from the cascode preamplifier 765 via the drain side bit line 760 toward the adjacent bit memory cell 756, and to all the other cells associated with the selected word line 710 on the drain side of the sensed cell 766. Therefore, the total sense current which flows from the cascode preamplifier 765 in a conventional arrangement, would be $I_{TOTAL}=I_{CORE}+I_{LEAKAGE}$, and may cause the read sense indication of the logical state of the memory cell to be incorrect or have an increased signal margin.

From another perspective, and according to an exemplary aspect of the present invention, with approximately the same voltage applied to both sides of the adjacent bit memory cell, there is no voltage drop across the adjacent bit, and therefore there can also be no current flow through the adjacent cell which would affect the sense current.

Another notable feature of the present invention relates to the selective drain column decode circuitry (650 of FIG. 9), which is operable to select a specific drain side bit line of the sensed cell and couple it to the cascode preamplifier (670 of FIG. 9, or 765 of FIG. 10), and to select the bit line of the drain side adjacent bit memory cell and couple it to the charge and hold circuit (660 of FIG. 9, or 755 of FIG. 10) during a read mode operation.

In another aspect of the invention, the source column decode circuitry (652 of FIG. 9) is operable to select a specific source side bit line of the sensed cell and couple it to the virtual ground select circuitry (690 of FIG. 9, or 778 of FIG. 10). Thus for a selected memory cell to be read having a drain terminal associated with a bit line $BL_X$, the selective drain column decode circuitry 650 is operable to select bit lines $BL_X$ and $BL_{X-1}$ for application of a drain-side voltage thereto (e.g., about 1.2 volts). In addition, for the selected memory cell (which has its drain terminal associated with bit line $BL_X$), the source column decode circuitry 652 is operable to select bit line $BL_{X-1}$ for application of a source-side potential thereto (e.g., circuit ground potential).

Although the column decode circuitry 650, 652 of FIG. 9 are illustrated separately for purposes of illustration, it should be appreciated that the decode circuitry for the bitline columns will typically be integrated into a single circuit, for example, as illustrated in the circuitry 450 of FIG. 5. Note, however, that the circuitry 650, 652 varies substantially from the circuitry 450 of FIG. 5 since decode circuitry 650, 652 is operable to select an adjacent bit line for precharge thereof as discussed herein.

Therefore, it has been shown that the scheme of the present invention may be used in virtual ground EPROM memory applications for (e.g., program, erase) memory operations to sense an indication of the flash memory cell logical state, which is substantially independent of charge sharing leakage currents to adjacent cells.

It is seen that the present invention, consumes less power than in conventional sensing schemes, as only two bit lines are charged in the array for a given sensed memory cell, by contrast to all the bit lines of a sector, or all the bit lines of an entire array for conventional sensing schemes. It is also seen that the charge sharing leakage current effects are eliminated from the cell sense current, producing memory cell readings which are more accurate with improved read signal margins. These features find usefulness in easing leakage requirements for manufacturing, and/or where memory cell leakages may be higher, and in association with memory devices employed in low power applications.

Thus the sensing scheme of the present invention maintains a charge on selected bit lines at a stable voltage just prior to cell current sensing, rather than trying to sample the cell during a dynamic discharge, permitting the read sense current to be stable throughout the sense operation, and to allow the timing of the sense operation to become unimportant. Both of these advantages yield a sensing scheme which produces a more stable output indication, without the variations due to charge sharing leakage currents, or read sense timing.

The above example has been discussed in conjunction with a traditional single-bit, stacked gate type flash memory cell. Alternatively, the memory cells in a memory device according to the present invention may comprise dual bit flash memory cell architectures, as may be desired and such alternatives are contemplated as falling within the scope of the present invention.

Figure 11:
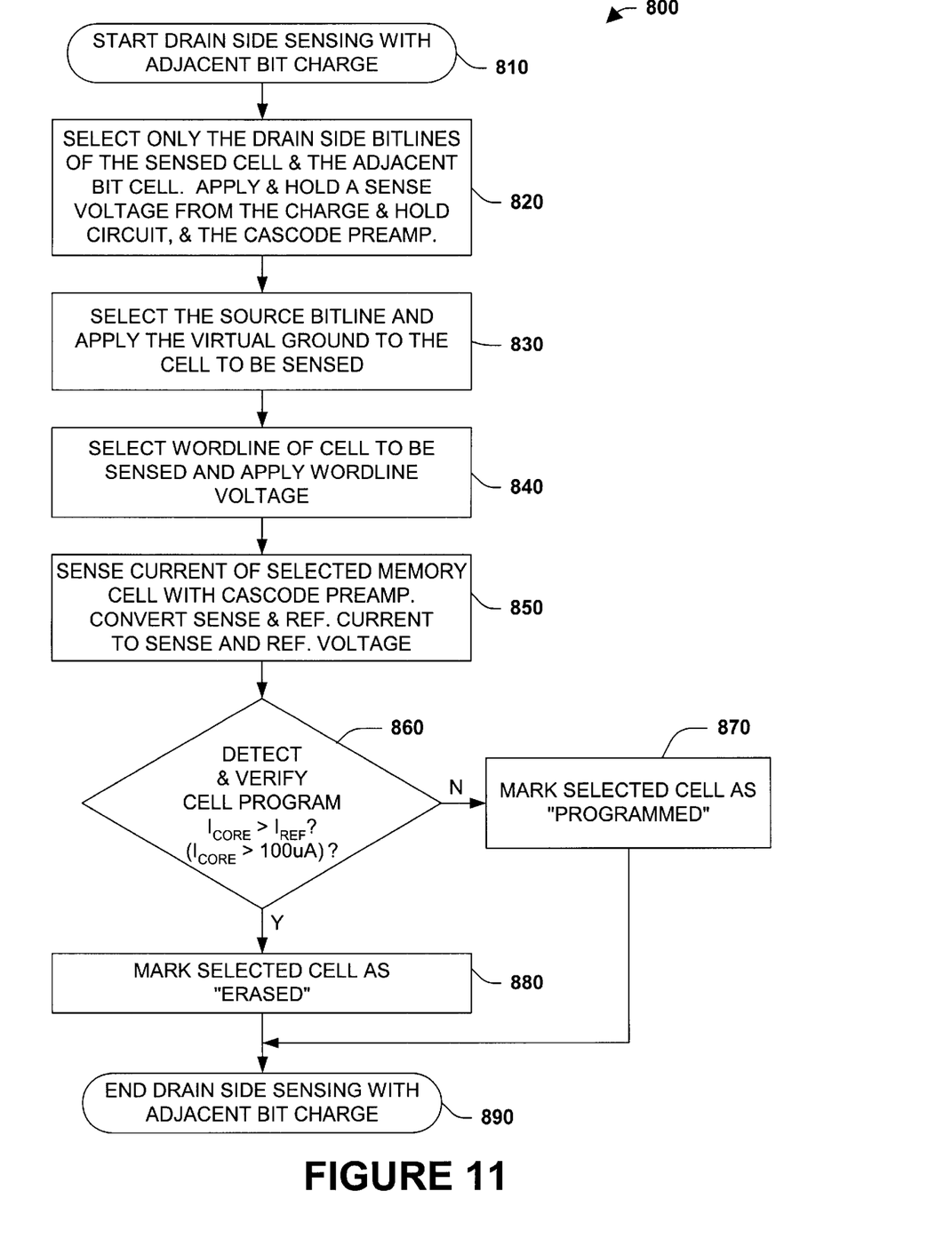
FIG. 11 is a flow diagram illustrating an exemplary method for sensing the state of a virtual ground flash EPROM cell in association with an aspect of the present invention.

Another aspect of the present invention provides a methodology for indicating the logical state of a virtual ground flash memory cell (drain side sensing with adjacent bit charge) in a read operation in a memory device, which may be employed in association with the memory devices illustrated and described herein, as well as with other memory devices. Referring now to FIG. 11, an exemplary method 800 is illustrated for sensing the state of a virtual ground flash EPROM memory cell in association with an aspect of the present invention. While the exemplary method 800 is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method 800 may be implemented in association with the apparatus and systems illustrated and described herein as well as in association with other systems not illustrated.

The method 800 comprises selecting a word line and bit lines associated with a memory cell to be read, and a bit line of an adjacent bit memory cell. The method 800 further comprises applying and holding a voltage to the adjacent cell bit line which is virtually the same as a sense voltage applied to the bit line of the cell to be sensed, and producing a core cell read sense current and associated read sense voltage. The method 800 further comprises producing a reference cell current and associated reference cell voltage, and determining the core cell logical state from a comparison of the read sense voltage and the reference voltage, in order to eliminate the charge sharing leakage current variations that would otherwise be reflected in the indication of the memory read sense operation. The virtual ground drain side sensing scheme with adjacent bit charge method begins at step 810. At 820 only the drain side bit lines of the cell to be sensed and the adjacent bit memory cell bit line are selected with the selective drain column decode circuitry (e.g., $BL_X$ for selected cell and $BL_{X-1}$ for adjacent cell), and a charge voltage $V_D$ (e.g., about 1.2 volts), which is virtually the same as a sense voltage applied to the bit line of the cell to be sensed, is applied and held to the drain side bit lines. At 830, the source bit line of the cell to be sensed (e.g., $BL_{X+1}$ for cell having drain connected to $BL_X$) is selected by the source column decode select circuitry, and the virtual ground circuit couples the ground to the source bit line of the cell to be sensed. The word line coupled to the gate of the sensed cell is selected and a word line voltage is applied at 840. At 850 the sense current $I_{CORE}$ of the selected memory core cell is sensed by the cascode preamplifier and converted to a sense voltage $V_{CORE}$ (e.g., 675 and 677 of FIG. 9), and a reference cell 692 generates a reference current $I^{REF}$ 693 which is converted within a reference cascode 695 into a reference voltage $V_{REF}$ (e.g., 678 of FIG. 9). Thereafter the core cell logical state is detected and indicated as an output of a sense amplifier (at 679 of FIG. 9) from a comparison of the read sense voltage $V_{CORE}$ and the reference voltage $V_{REF}$ at step 860. The output of the sense amplifier results in either a programmed logical state in step 870 if the cell current is not greater than the reference cell current, or an erased or unprogrammed logical state in step 880 if the cell current is greater than the reference cell current. In either event, the drain side sensing scheme with adjacent bit charge operation thereafter ends at 890, and the method 800 may be repeated for subsequent erase or program sense operations of the memory device.

The methodology 800 thus provides for a stable, low power, accurate memory cell sense reading in a selective bit line, charge and hold, and sense circuitry which applies and holds a voltage which is virtually the same as the cell read sense voltage and uses such voltage to eliminate the charge sharing leakage current variations that would otherwise be reflected in the indication of the memory read sense operation. The drain side sensing scheme with adjacent bit charge is thus substantially independent of charge sharing leakage current variations and may be used for erase or program sense operations of virtual ground flash EPROM memory arrays. Other variants of methodologies may be provided in accordance with the present invention, whereby a cell sensing scheme is used to eliminate the effects of cell or bit line leakage currents.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A system for producing an indication of the logical state of a flash memory cell for a virtual ground flash memory architecture, comprising:

a virtual ground flash memory array configured with columns of cells associated with bit lines, and rows of cells of the array associated with word lines for selection of core cells of the array, wherein the drain and source terminals of cells associated with a given word line are coupled in series between respective bit lines, and the gates of the cells are coupled to respective word lines;

a core cell sensing circuit which is operable to generate a bit line voltage and sense a core cell current at a bit line associated with a drain terminal of a selected memory cell to be sensed, and produce an indication of the flash memory cell logical state;

a bit line charge and hold circuit configured to apply and maintain a drain terminal voltage to a bit line associated with a drain terminal of a cell adjacent to the selected cell to be sensed during a read operation, wherein the applied drain terminal voltage is substantially the same as the bit line voltage applied to the drain terminal bit line of the selected memory cell to be sensed; and a selective bit line decode circuit which is operable to select the bit lines of the selected memory cell to be sensed and the bit line of the adjacent cell during memory read operations, wherein applying a voltage to the bit line of the cell adjacent to the cell being sensed, eliminates the charge sharing leakage current which is typically lost to the adjacent memory cell.

2. The system of claim 1, wherein the selective bit line decode circuit comprises a selective drain column decode circuit which is operable to select the drain terminal bit line of the selected memory cell to be sensed and a drain bit line of the adjacent cell during a memory read operation, for application thereto of substantially the same voltage, thereby substantially shorting out the adjacent cell and prohibiting substantially leakage current associated therewith.

3. The system of claim 1, wherein the core cell sensing circuit comprises:

a cascode preamplifier circuit operable to sense a core cell sense current associated with the memory cell to be sensed, to produce a core cell sense output voltage value which is associated with the core cell sense current;

a reference cascode circuit operable to generate a reference cell current associated with a reference cell, and to produce a reference output voltage value which is associated with the reference cell current; and a sense amplifier which produces an indication of the flash memory cell logical state from a comparison of the core cell sense output voltage value of the cascode preamplifier circuit and the reference output voltage value of the reference cascode circuit.

4. The system of claim 1, wherein the selective bit line decode circuit comprises a selective source column decode circuit which is operable to select a source bit line of the selected memory cell for application of a source terminal voltage thereto during a memory read operation.

5. The system of claim 4, wherein the source terminal voltage comprises a circuit ground potential.

6. A system for reading a flash memory cell in a virtual ground flash memory architecture, comprising:

a virtual ground flash memory array comprising a row of series connected flash memory cells, each having a gate terminal coupled to a common word line, and wherein a source terminal of a flash memory cell in the row is coupled to a drain terminal of an adjacent flash memory cell in the row at a node, and wherein each node in the row is coupled to a separate bit line;

means for identifying a flash memory cell in the virtual ground flash memory array for reading its logic state;

means for coupling a drain terminal voltage to the drain terminal of the identified flash memory cell;

means for coupling a source terminal voltage to the source terminal of the identified flash memory cell; and means for shorting out a flash memory cell which is adjacent to the drain terminal of the identified flash memory cell during a read operation of the identified flash memory cell, thereby eliminating substantially leakage current in the adjacent flash memory cell and improving a read accuracy of the identified flash memory cell.

7. The system of claim 6, wherein the means for shorting out the adjacent flash memory cell comprises means for coupling and maintaining a voltage substantially equal to the drain terminal voltage to a drain terminal of the adjacent flash memory cell during a cell read operation of the identified flash memory cell.

8. A system for reading a flash memory cell, comprising:

a virtual ground flash memory array comprising a row of series connected flash memory cells, each having a gate terminal coupled to a common word line, and wherein a source terminal of a flash memory cell in the row is coupled to a drain terminal of an adjacent flash memory cell in the row at a node, and wherein each node in the row is coupled to a separate bit line;

a decode circuit operable to receive data relating to a selected cell for reading data associated therewith, and operable to selectively couple a bit line associated with a drain terminal to a drain terminal read voltage, and a bit line associated with a source terminal of the selected cell to a source terminal read voltage, and further operable to selectively couple a bit line associated with a drain terminal of a flash memory cell which is adjacent to the drain terminal of the selected cell to a voltage value approximately equal to the drain terminal read voltage, thereby substantially shorting out the adjacent cell during a read operation of the selected cell and substantially eliminating leakage current associated therewith.

9. The system of claim 8, wherein the decode circuit further comprises:

a cascode preamplifier circuit operable to couple the drain terminal read voltage to the drain terminal of the selected cell; and a charge and hold circuit operable to couple and maintain the voltage value approximately equal to the drain terminal read voltage to the drain terminal of the adjacent cell during the read operation of the selected cell.

10. The system of claim 8, wherein the decode circuit is operable to maintain remaining bit lines not associated with the selected cell or the adjacent cell in a floating state or a high impedance state, respectively.

11. A method of performing a memory cell current read operation in a virtual ground flash memory device, comprising the step of:

selecting bit lines bounding a cell to be sensed;

selecting a bit line associated with a drain terminal of a cell adjacent to the cell to be sensed;

applying a source terminal voltage to the selected bit line coupled to a source terminal of the cell to be sensed;

applying a cell sense voltage to the selected bit line coupled to a drain terminal of the cell to be sensed;

selecting a word line coupled to a gate of the cell to be sensed and applying a read voltage thereto;

applying and holding a charge voltage to the selected adjacent cell bit line, wherein the charge voltage is substantially the same voltage as the cell sense voltage applied to the drain bit line of the cell to be sensed, thereby substantially shorting out the adjacent cell during a read operation of the cell to be sensed; and sensing a core cell logical state indication from the core cell sense current on a drain side of the cell to be sensed.

12. The method of claim 11, wherein sensing a core cell logical state comprises:

sensing a core cell sense current with a cascode preamplifier which generates a core cell sense current in association with the memory cell, and produces an output voltage value which is associated with the core cell sense current;

producing a reference cell output voltage which is associated with a reference cell current from a reference cell and a reference cascode; and producing an indication of the flash memory cell logical state with a sense amplifier which is operable to receive the voltage output of the cascode preamplifier and the reference cascode, wherein the adjacent cell bit line voltage, which is substantially the same as the cell sense voltage applied to the bit line associated with the drain terminal of the memory cell, causes the sense amplifier indication to be substantially independent of charge sharing leakage currents to adjacent cells.

13. The method of claim 11, further comprising maintaining nonselected bit lines along the word line associated with the cell to be sensed in a floating state or a high impedance state, respectively.

* * * * *

UNITED STATES PATENT AND TRADEMARK OFFICE
CERTIFICATE OF CORRECTION

PATENT NO. : 6,510,082 B1
DATED : January 21, 2003
INVENTOR(S) : Binh Q. Le et al.

It is certified that error appears in the above-identified patent and that said Letters Patent is hereby corrected as shown below:

<u>Column 4,</u>
Line 38, please replace the formula "$BL_{+1}$" with the formula -- $BL_{x+1}$ --.
Line 58, please replace the word "to" with the formula -- $t_o$ --.

<u>Column 10,</u>
Line 42, please replace the formula "$BL_{x-1}$" with the formula -- $BL_{x+1}$ --.

<u>Column 23,</u>
Line 8, please replace the formula "$I^{REF}$" with the formula -- $I_{REF}$ --.

Signed and Sealed this

Eighteenth Day of March, 2003

JAMES E. ROGAN
*Director of the United States Patent and Trademark Office*